(12) United States Patent
Katsap et al.

(10) Patent No.: US 6,448,569 B1
(45) Date of Patent: Sep. 10, 2002

(54) BONDED ARTICLE HAVING IMPROVED CRYSTALLINE STRUCTURE AND WORK FUNCTION UNIFORMITY AND METHOD FOR MAKING THE SAME

(75) Inventors: Victor Katsap, Belle Mead; Warren K. Waskiewicz, Clinton, both of NJ (US)

(73) Assignee: Agere Systems Guardian Corporation, Orlando, FL (US)

( * ) Notice: Subject to any disclaimer, the term of this patent is extended or adjusted under 35 U.S.C. 154(b) by 0 days.

(21) Appl. No.: 09/337,741

(22) Filed: Jun. 22, 1999

(51) Int. Cl.$^7$ .............................. G21G 4/00; G21G 4/04
(52) U.S. Cl. ................................ 250/493.1; 250/423 F
(58) Field of Search ............................ 250/397, 423 R, 250/493.1

(56) References Cited

U.S. PATENT DOCUMENTS

| | | | |
|---|---|---|---|
| 4,430,570 A | * 2/1984 | Takigawa et al. | ....... 250/423 R |
| 5,426,686 A | 6/1995 | Rentzepis et al. | |
| 6,130,502 A | * 1/2000 | Kobayashi et al. | ......... 313/446 |

OTHER PUBLICATIONS

W. DeVore et al., "High emittance electron gun for projection lithography", 1998 American Vacuum Society, J. Vac. Sci. Technol. B14(6), Nov./Dec., 1996, pp. 3764–3769.

W.K. Waskiewicz et al., "Design of a Low–Brightness, Highly Uniform Source for Projection Electron–Beam Lithography (SCALPEL)", Proc. SPIE, 3155, 1997.

J. Hasker et al., "Cathode and Scaling Properties Related to the Shape of Current–Voltage Characteristics", Applied Surface Science 24 (1985), pp. 318–329.

Robert Bakish, "Introduction to Electron Beam Technology", pp. 73–74.

\* cited by examiner

Primary Examiner—John R. Lee
Assistant Examiner—David Vanore
(74) Attorney, Agent, or Firm—Harness, Dickey & Pierce, P.L.C.

(57) ABSTRACT

A bonded article including a single crystal cathode, for use in projection electron beam lithography, such as the SCALPEL™ system. Because of its single crystalline structure, the single crystal cathode has only slightly misoriented grains. As a result, the single crystal cathode has few structural non-uniformities, and therefore a uniform emission characteristic. The single crystal cathode may be made of at least one of tantalum, tungsten, rhenium, and molybdenum. A local bonding technique for bonding a single crystal cathode with a conventional member. The local bonding technique does not recrystallize a center of the single crystal cathode, and therefore produces a bonded article which is usable in a projection electron lithography system, such as the SCALPEL™ system. The local bonding technique may be laser welding and the single crystal cathode may be made of at least one of tantalum, tungsten, rhenium, and molybdenum. The member may be a conventional filament and the filament may be made of one of tungsten, a tungsten-rhenium alloy, and a tungsten-tantalum alloy.

21 Claims, 5 Drawing Sheets

SPOT WELDS

BONDED ARTICLE HAVING IMPROVED CRYSTALLINE STRUCTURE AND WORK FUNCTION UNIFORMITY AND METHOD FOR MAKING THE SAME

BACKGROUND OF THE INVENTION

1. Field of the Invention

The present invention relates to a bonded article for use in electron beam projection lithography and a method for making the bonded article, and more particularly, to a bonded article including a cathode with an improved work function and a method for making the bonded article including the improved work function cathode utilizing a localized bonding technique.

2. Description of the Related Art

Projection electron beam lithography, such as Scattering Angular Limitation Projection Electron Beam Lithograph (SCALPEL™), utilizes electron beam radiation projected onto a patterned mask to transfer an image of that pattern into a layer of energy sensitive material formed on a substrate. That image is developed and used in subsequent processing to form devices such as integrated circuits.

The SCALPEL™ mask has a membrane of a low atomic number material on which is formed a layer of high atomic number material. The layer of high atomic number material has a pattern delineated therein. Both the low atomic number membrane material and the high atomic number patterned layer of material are transparent to the electrons projected thereon (i.e., electrons with an energy of about 100 keV). However, the low atomic number membrane materials scatters the electrons weakly and at small angles. The high atomic number patterned layer of material scatters the electrons strongly and at large angles. Thus, the electrons transmitted through the high atomic number patterned material have a larger scattering angle than the electrons transmitted through the membrane. This difference in scattering angle provides a contrast between the electrons transmitted through the membrane alone and the electrons transmitted through the layer of patterned material formed on the membrane.

This contrast is exploited to transfer an image of the pattern from the mask and into a layer of energy sensitive material by using a back focal plane filter in the projection optics between the mask and the layer of energy sensitive material. The back focal plane filter has an aperture therein. The weakly scattered electrons are transmitted through the aperture while the strongly scattered electrons are blocked by the back focal plane filter. Thus, the image of the pattern defined in the weakly scattered electrons is transmitted through the aperture and into the layer of energy sensitive material.

FIG. 1 is a schematic diagram illustrating the concept of a conventional SCALPEL™ system. A beam B of electrons 10 is directed towards a scattering mask 9 including a thin membrane 11 having a thickness between about 1,000 Å and about 20,000 Å (0.1 $\mu$m and about 2 $\mu$m thick). The membrane 11 is composed of a material which is virtually transparent to the electron beam B composed of electrons 10. That is to say that electrons 10 in beam B pass through membrane 11 freely in the absence of any other object providing an obstruction to the path of electrons 10 in the beam B as they pass from the source of the beam through the membrane 11.

Formed on the side of the membrane 11 facing the beam 10, is a pattern of high density scattering elements 12 to provide a contrast mechanism that enables reproduction of the mask pattern at the target surface. The scattering elements 12 are patterned in the composite shape which is to be exposed upon a work piece 17 (usually a silicon wafer) which is coated with E-beam sensitive resist, which as shown in FIG. 1 has been processed into pattern elements 18. The electrons 10 from the E-beam B which pass through the mask 9 are shown by beams 14 which pass through electromagnetic lens 15 which focuses the beams 14 through an aperture 16' into an otherwise opaque back focal plane filter 16. The aperture 16' permits only electrons scattered at small angles to pass through to the work piece 17.

A conventional SCALPEL™ exposure tool is illustrated in FIG. 2. The exposure tool 20 includes a source 22 (usually an electron gun), a mask stage 24, imaging optics 26, and a wafer stage 28. The mask stage 24 and the wafer stage 28 are mounted to the top and bottom of a block of aluminum, referred to as the metrology plate 30. The metrology plate 30, which is on the order of 3000 lbs., serves as a thermal and mechanical stabilizer for the entire exposure tool 20.

FIG. 3 illustrates a prior art source 22 in more detail. The source 22 includes a cathode 42, an anode 43, a grid electrode 44, focusing plates 45, and a filament 46. The cathode 42 and the filament 46 comprise a conventional bonded article 49. Each of the cathode 42, anode 43, grid electrode 44, and focusing plates 45 exhibit substantial circular and radial symmetry about an imaginary line of focus 50. In the prior art systems in U.S. Pat. No. 5,426,686, the cathode 42 is made of gallium arsenide (GaAs), bialkali cathode materials, cesium antimonide ($Cs_3Sb$), or a pure material having a low work function, such as tantalum (Ta), samarium (Sm), or nickel (Ni). In other prior art systems disclosed in U.S. Pat. No. 5,426,686, the cathode 42 is made of a metal added to a semiconductor material by mixing or by depositing through sputtering or annealing. The metal is preferably tantalum (Ta), copper (Cu), silver (Ag), aluminum (Al), or gold (Au), or oxides or halides of these metals. One such example of a prior art cathode is constructed from tantalum (Ta) annealed on the surface of nickel (Ni).

Most e-beam lithography systems (direct e-beam writing machines, etc.) require essentially point electron sources with high current densities. Conventional thermionic cathodes, such as pure metal (tungsten or tantalum), lanthanum hexaboride ($LaB_6$), etc. cathodes are sufficient for these applications.

In contrast, SCALPEL™ systems require a 1 $mm^2$ approximately parallel electron beam with a cross-sectional current density variation of around 2%. Conventional thermoionic cathodes have work function variations substantially greater than 2%, for example 5–10%. However, as noted on page 3769 of "High emittance electron gun for projection lithography," W. Devore et al., 1998 American Vacuum Society, J. Vac. Sci. Technol. B 14(6), November/December 1996, pp. 3764–3769, the SCALPEL™ process requires a thermoionic cathode with a work function variation less than 2%.

The conventional thermoionic cathodes, which meet the SCALPEL™ requirements for other parameters, such as emission uniformity, low work function, low evaporation rate, high voltage operating environment, and vacuum contamination resilience are tantalum (Ta) cathodes (such as the cathode disclosed in U.S. Pat. No. 5,426,686) having a disk shape. The disk-shaped tantalum (Ta) cathode is made from cold or hot rolled tantalum (Ta) foils which are hot pressed into a micro-polycrystalline material. Because of its polycrystalline nature, the grains are misoriented with each other on the order of 5–20°. The conventional polycrystalline Ta cathode also has an uncontrolled grain size distribution between 5–400 μm. Due to the sensitivity of tantalum's work function to the crystallographic orientation and the crystal grain size distribution, the conventional polycrystalline Ta cathode work function distribution is "patchy", varying from grain-to-grain (because of differing orientations and sizes) and resulting in an unacceptably patchy or non-uniform emission pattern. Growth of the misoriented and differing sized grains further aggravates the patchiness problem. The non-uniformities caused by grain misorientation, grain size differences, and grain growth on the cathode surface are transferred by the SCALPEL™ electron optics down to the shaping aperture (the object plane) and eventually to the wafer surface (the imaging plane).

When used as a SCALPEL™ cathode, the conventional polycrystalline cathode materials experience grain growth and rough texture development at the SCALPEL™ high operating temperatures (1200–2000° C.) and extended time period (greater than 1000 hours). Although the total emission current is satisfactory, structural developments at the cathode surface causes dark spots to appear on the cathode surface and make the cathode unacceptable for SCALPEL™. In addition, conventional cathode materials, such as $LaB_6$, are easily contaminated by the SCALPEL™ operating environment, as described in "Design of a low-brightness, highly uniform source for projection electron-beam lithography (SCALPEL)", W. K. Waskiewicz et al., Proc. SPIE, 3155 (1997).

Further, conventional cathodes, such as cathode 42 illustrated in FIG. 3 and cathodes made of $LaB_6$ are bonded to their corresponding filament 46 by traditional global bonding techniques, such as spot welding. However, spot welding modifies the structure of a large area adjacent to the weld spot. Also, in order to bond the filament 46 and the cathode 42, the filament 46 must be pressed heavily against the surface of the cathode 42 and a high current must be run through to bring the point of interaction to a very high temperature.

During traditional spot welding, the high current runs through the entire cathode 42 causing "global" thermal radiance and related stress/tension over the entire cathode 42. These stresses and tensions cause crystallographic structural changes which result in grain misorientations of 5–20°. In the traditional spot welding techniques, for a minimum spot welding pressure force at 200 g, with a filament disc contact area of 75×200 $\mu m^2$, the pressure may exceed $1.3 \times 10^3$ $kg/cm^2$, which may be greater than the cathode 42 deformation limit. As a result, while the portion of the cathode peripheral to the weld spot is not degraded, from an emission standpoint, the re-crystallized center renders a spot welded cathode unusable in the SCALPEL™ source. FIG. 4 illustrates two examples of a misoriented crystalline center induced by spot welding.

SUMMARY OF THE INVENTION

The present invention solves the problems with conventional bonded articles used in SCALPEL™ and similar projection electron lithography systems by providing a bonded article including a single crystal cathode and a member that provides heat and/or structural support, where the crystal structure of the single crystal cathode is preserved after bonding to the member. The single crystal cathode of the present invention need not be an absolute "single" crystal, but is defined as a structure that has ±1° variations.

Because of its single crystalline structure, the single crystal cathode does not have misoriented grains. As a result, the single crystal cathode of the present invention has fewer structural non-uniformities than the conventional micro-polycrystalline foils and therefore, a more uniform emission characteristic. In a more preferred embodiment, the single crystal cathode is made of tantalum.

The present invention also solves the problems with bonding a single crystal cathode of the present invention with conventional heat supplying and/or structural support members (such as filament 46 in FIG. 3) used in SCALPEL™ and similar projection electron lithography systems by utilizing a local bonding technique to bond the single crystal cathode and the member together. A local bonding technique does not recrystallize a center of the single crystal cathode, and therefore produces a bonded single crystal cathode and member which is usable in a projection electron lithography system, such as the SCALPEL™ system.

In a more preferred embodiment, the local bonding technique is laser welding. In an even more preferred embodiment, the member is a filament that provides both heat and structural support to the single crystal cathode. In an even more preferred embodiment, the single crystal cathode is made of tantalum and the filament is made of one of tungsten, a tungsten-rhenium alloy, and a tungsten-tantalum alloy.

DETAILED DESCRIPTION OF THE PREFERRED INVENTION

Figure 5:
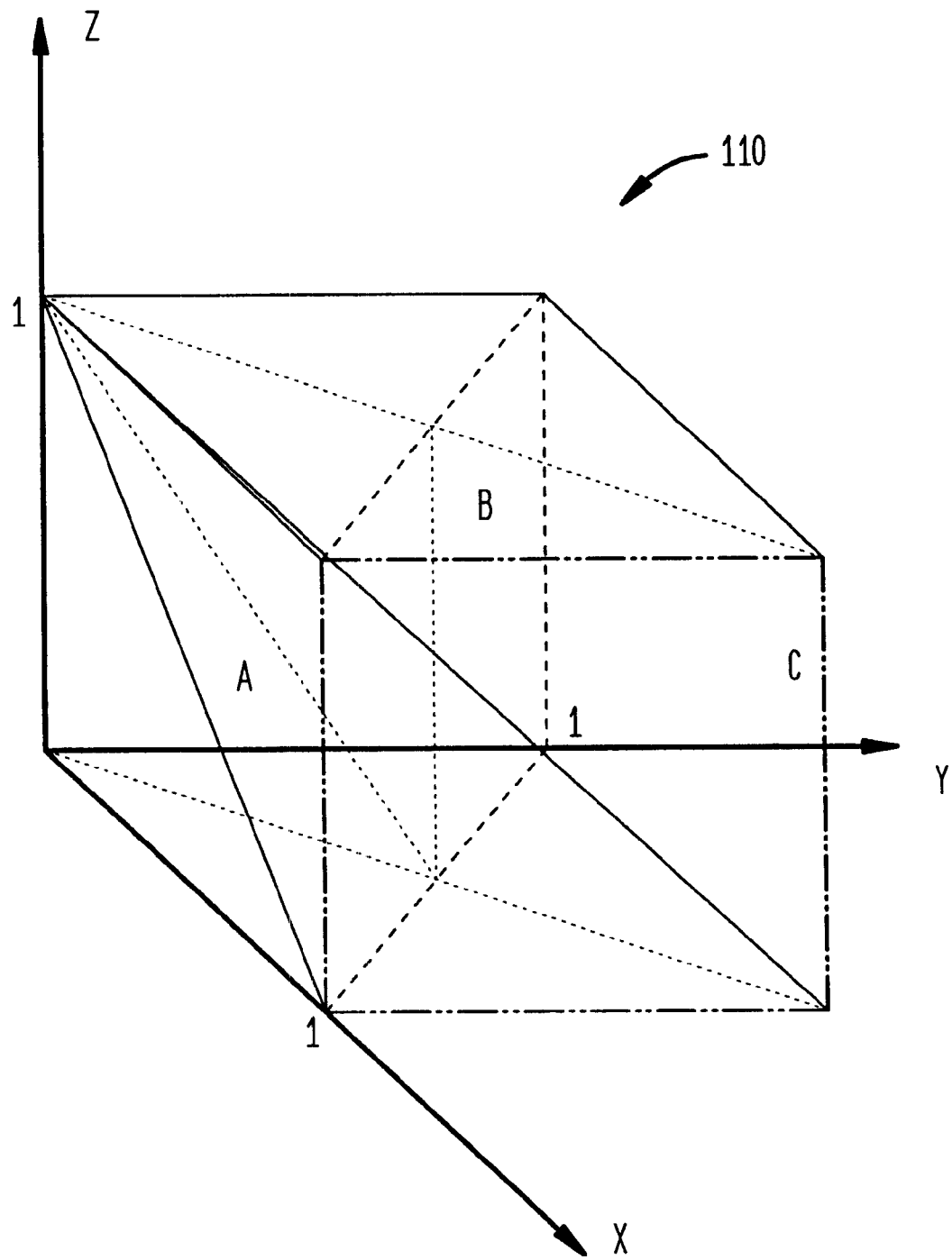
FIG. 5 illustrates the crystallographic structure of the general cathode of the present invention in one embodiment.

FIG. 5 illustrates a general cathode 110 of the present invention in one embodiment. In particular, cathode 110 is a single crystal, in contrast to the conventional micro-polycrystalline tantalum foils. The single crystal cathode of the present invention need not be an absolute "single" crystal, but is defined as a structure that has ±1° variations. Because of its single crystalline structure, the single crystal cathode does not have misoriented grains. As a result, the cathode 110 of the present invention has fewer structural non-uniformities than the conventional micro-polycrystalline foils and therefore, a more uniform emission characteristic. As a result, the single crystal cathode 110 of the present invention solves the patchiness problems with conventional cathodes. Further, one or more of the crystalline planes of the single crystal cathode 110 has a work function variation substantially less than 2%, which is sufficiently uniform to be used as SCALPEL™ (and similar projection electron lithography) process thermoionic cathode.

In a more preferred embodiment, the cathode 110 is made of a refractory crystalline material, such as tantalum, tungsten, rhenium or molybdenum. In another preferred embodiment, the cathode 110 is made of an alloy including at least one of tantalum, tungsten, rhenium or molybdenum.

In an even more preferred embodiment, the single crystal cathode 110 is made of tantalum. Tantalum has a body centered cubic (bcc) structure. As illustrated in FIG. 5, both emissive planes A (100) and B (111) of the tantalum single crystal have relatively low work functions, 4.0 eV and 4.15 eV, respectively, in contrast to conventional polycrystalline foil cathodes, which have work functions of approximately 4.25 eV. Emissive plane C (110) has a relatively high work function of 4.8 eV. As is known to one of ordinary skill in the art, work function and current are inversely related; the lower the work function, the higher the current that can be generated. Therefore, both emissive planes A (100) and B (111) permit the SCALPEL™ system in which they are used, to produce a higher current.

Figure 1:
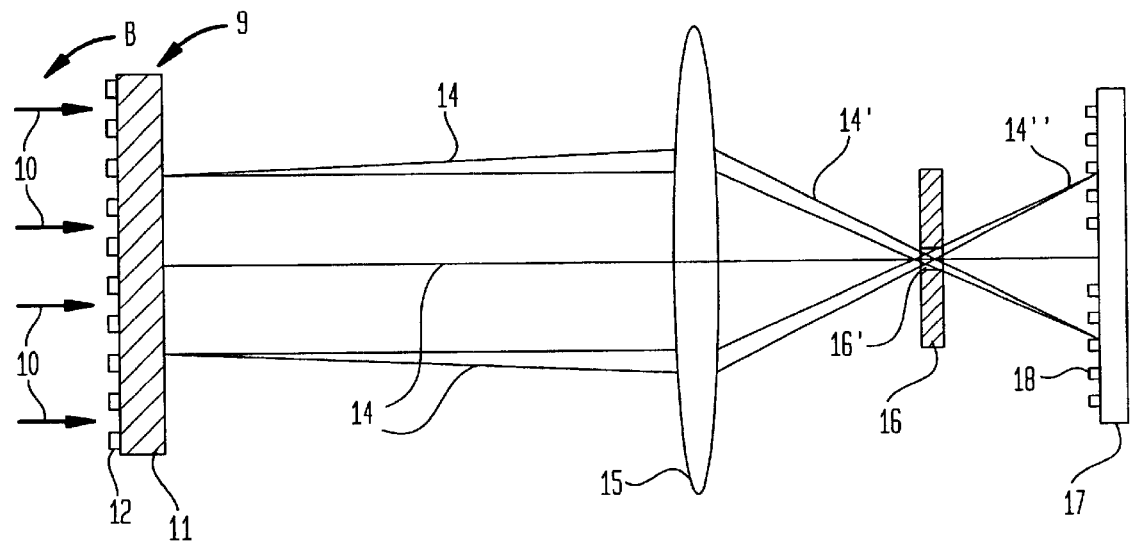
FIG. 1 is a schematic diagram illustrating the concept of a SCALPEL™ (Scattering Angle Limited Projection E-beam Lithography) system.
Figure 2:
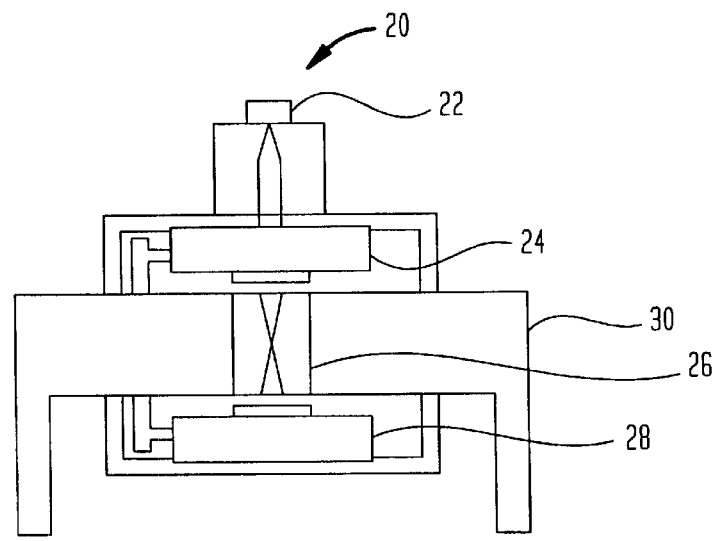
FIG. 2 illustrates a conventional SCALPEL™ exposure tool.
Figure 3:
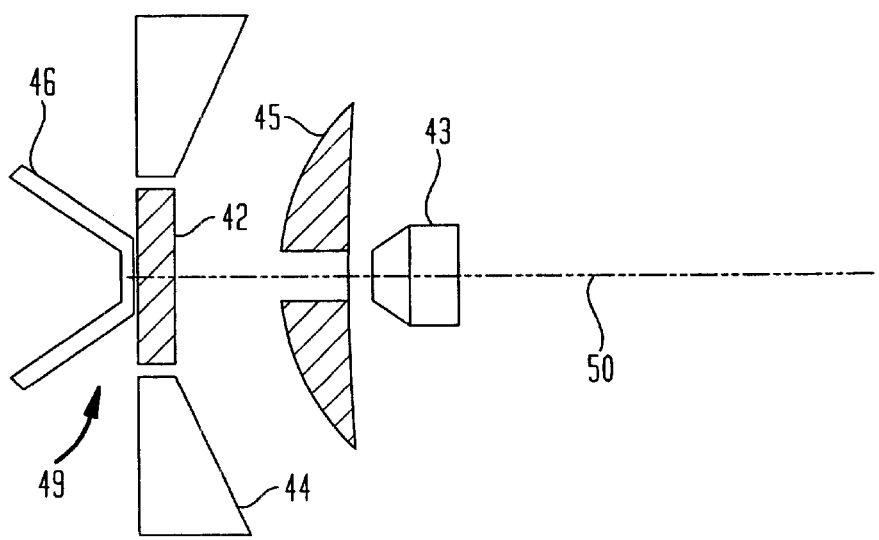
FIG. 3 illustrates a conventional source for the SCALPEL™ system of FIG. 1.
Figure 6:
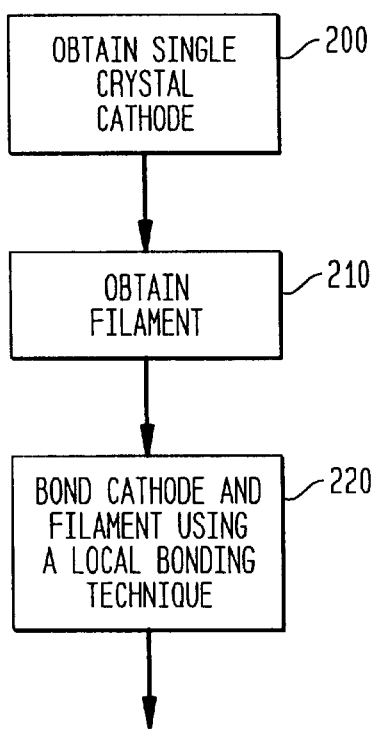
FIG. 6 illustrates a method of bonding a single crystal cathode of the present invention with a conventional filament, in another embodiment of the present invention.
Figure 4:
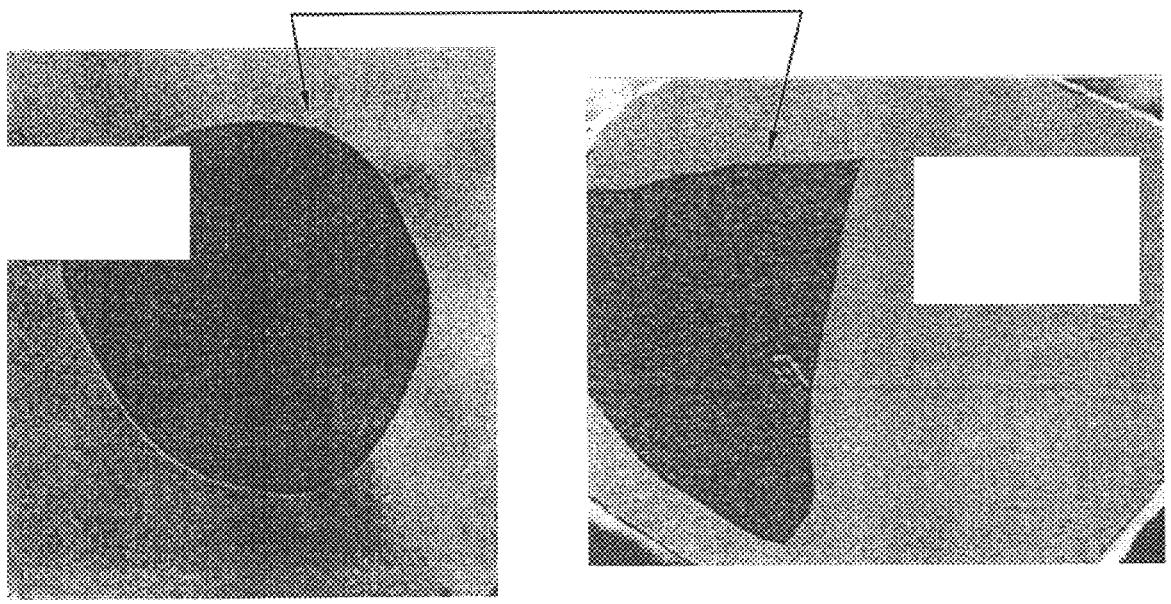
FIG. 4 illustrates two examples of a misoriented crystalline center induced by spot welding.

FIG. 6 illustrates a method of bonding the general cathode 110 to a conventional heat supplying/structural member, such as filament 46 in FIG. 3, to produce a bonded article, in one embodiment of the present invention. In steps 200 and 210, the single crystal cathode 110 and filament 46, respectively, are obtained. In step 220, the single crystal cathode 110 and filament 46 are bonded using a local bonding technique.

A global bonding technique, such as spot welding cannot be used to bond the cathode 110 of the present invention to a filament 46, because spot welding modifies the structure of the single crystal cathode 110 in an area adjacent to the weld spot. The filament 46 must be pressed heavily against a surface of the tantalum single crystal and a high current (up to 1,000 A) must be run through to bring the point of interaction to a temperature of at least 3,000° C. During traditional spot welding, the high current runs through the entire cathode 110 causing global thermal radiance and related stress/tension over the entire cathode 110.

The present invention solves the problems with bonding a single crystal cathode of the present invention with conventional filaments by utilizing a local bonding technique to bond the single crystal cathode 110 and the filament 46 together. A local bonding technique does not recrystallize (by causing the grain misorientation to increase to 5–20°) a center of the single crystal cathode, and therefore produces a bonded article including single crystal cathode 110 and filament 46 which is usable in a projection electron lithography system, such as the SCALPEL™ system.

In a more preferred embodiment, the local bonding technique is laser welding. Laser welding is significantly different from traditional spot welding, in that laser welding does not depend on sample surface roughness, surface and volumetric electrical resistance, supporting jig resistance, sample and jig thermal conductivity. Laser welding does depend on the sample melting point and to some extent, on the sample surface optical reflection and cleanness. As a result, laser welding is effective in bonding two different materials, for example molybdenum and stainless steel or iridium and tungsten. Another attractive feature of laser welding is its inherent "pointness"; the laser spot is tightly focused down to a 150–200 $\mu$m Dia. and the weld depth does not even approach 50 $\mu$m. As a result of its limited heating area and laser pulse short duration, typically a few microseconds, laser welding can be thermally characterized as a pure adiabatic process, namely, when a cathode's microscopic area is melted, the surrounding area remains cold. This is one major advantage of laser welding over spot welding, namely, laser welding works on microscopic part of an entire cathode, whereas spot welding affects a large cathode area.

In an even more preferred embodiment, the single crystal cathode is made of tantalum. In an even more preferred embodiment, the single crystal cathode is disk-shaped and has a diameter of 600–1500 $\mu$m and a height of 200–300 $\mu$m. In an even more preferred embodiment, the conventional member is both a heat supplying and structural support member. In an even more preferred embodiment, the conventional member is a ribbon shaped filament. In an even more preferred embodiment, the filament is made of one of tungsten, a tungsten-rhenium alloy, and a tungsten-tantalum alloy. In an even more preferred embodiment, the single crystal cathode 110 is utilized in a source which includes Kovar™ or molybdenum/rhenium (Mo/Re) posts, and a tungsten (W) filament.

EXAMPLE 1

Figure 7:
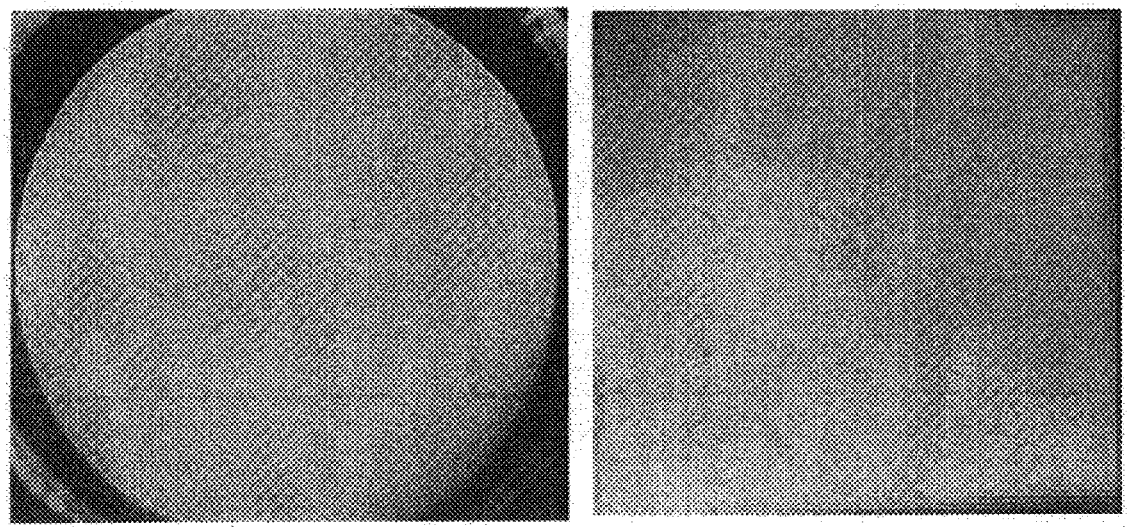
FIG. 7 illustrates a laser-welded tantalum single crystalline cathode emission image.

A typical tantalum single crystal cathode disc dimensions are 1 mm Dia and 0.2 mm thickness, and its mass is $2.6 \times 10^3$ gms. The specific heat of tantalum is 0.15 J/gm. If a laser weld spot is 200 $\mu$Dia and 50$\mu$ deep, the tantalum mass to be melted is $2.7 \times 10^{-5}$ g, and assuming the necessary spot temperature elevation from room temperature to a melting point of 3,000° C., the amount of absorbed heat is 12 mJ. If this heat is dissipated entirely in the tantalum cathode, then the entire tantalum cathode disc would be warmed only by 62° C. In contrast, a spot welding current pulse would elevate the entire tantalum cathode disc temperature by approximately 500° C., because the lowest pulse energy producing a reliable weld is approximately 4 J. FIG. 7 illustrates a laser-welded tantalum single crystalline cathode emission image. As illustrated in FIG. 7, neither grains nor boundaries are detected. As desired, the laser weld did not adversely affect the cathode's sensitive crystalline structure.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A bonded article comprising:
   a single crystal cathode; and
   a member, bonded to said substantially single crystal cathode such that a single crystalline structure of the single crystal cathode is preserved after bonding.

2. The bonded article of claim 1, said single crystal cathode having reduced structural and emissive non-uniformities.

3. The bonded article of claim 1, wherein said single crystal cathode is made of tantalum.

4. The bonded article of claim 3, wherein an emissive plane of said substantially single crystal cathode has a relatively low work function.

5. The bonded article of claim 4, wherein the emissive plane is the (111) plane.

6. The bonded article of claim 4, wherein the emissive plane is the (100) plane.

7. The bonded article of claim 1, wherein said single crystal cathode is a refractory crystalline material or alloy with a relatively low work function.

8. The bonded article of claim 1, wherein said single crystal cathode is part of a projection electron lithography system.

9. The bonded article of claim 8, wherein the projection electron lithography system is a SCALPEL™ system.

10. A method of bonding a single crystal cathode, having a grain structure, to a member, comprising:
   obtaining the single crystal cathode;
   obtaining the member; and
   bonding the single crystal cathode and the member together by a local bonding technique, such that a single crystalline structure of the single crystal cathode is preserved after bonding.

11. The method claim 10, wherein the local bonding technique is laser welding.

12. The method of claim 10, wherein the single crystal cathode has reduced structural and emissive non-uniformities.

13. The method of claim 10, wherein the single crystal cathode is made of tantalum.

14. The method of claim 13, wherein an emissive plane of said single crystal cathode has a relatively low work function.

15. The method of claim 14, wherein the emissive plane is the (111) plane.

16. The method of claim 14, wherein the emissive plane is the (100) plane.

17. The method of claim 10, wherein the single crystal cathode is a refractory crystalline material or alloy with a relatively low work function.

18. The method of claim 10, wherein the single crystal cathode is part of a projection electron lithography system.

19. The method of claim 18 wherein the projection electron lithography system is a SCALPEL™ system.

20. The method of claim 10, wherein the member is a filament, made of one of tungsten, a tungsten-rhenium alloy, and a tungsten-tantalum alloy.

21. The bonded article of claim 1, wherein the member is a filament, made of one of tungsten, a tungsten-rhenium alloy, and a tungsten-tantalum allow.

* * * * *